US008882912B2

(12) United States Patent
Kirscht et al.

(10) Patent No.: US 8,882,912 B2
(45) Date of Patent: Nov. 11, 2014

(54) METHOD AND SYSTEM FOR FORMING A SILICON INGOT USING A LOW-GRADE SILICON FEEDSTOCK

(75) Inventors: Fritz Kirscht, Berlin (DE); Vera Abrosimova, Berlin (DE); Matthias Heuer, Leipzig (DE); Dieter Linke, Berlin (DE); Jean Patrice Rakotoniana, Berlin (DE); Kamel Ounadjela, Belmont, CA (US)

(73) Assignee: Silicor Materials Inc., San Jose, CA (US)

( * ) Notice: Subject to any disclaimer, the term of this patent is extended or adjusted under 35 U.S.C. 154(b) by 0 days.

(21) Appl. No.: 13/034,956

(22) Filed: Feb. 25, 2011

(65) Prior Publication Data

US 2011/0211995 A1    Sep. 1, 2011

Related U.S. Application Data

(62) Division of application No. 11/828,734, filed on Jul. 26, 2007, now Pat. No. 7,955,433.

(51) Int. Cl.
*C30B 11/00*     (2006.01)
*H01L 31/18*     (2006.01)

(52) U.S. Cl.
CPC ................ *H01L 31/1804* (2013.01); *Y02E 10/547* (2013.01)
USPC ........................................................ 117/206

(58) Field of Classification Search
USPC .......................... 117/208, 213, 217, 218, 220
See application file for complete search history.

(56) References Cited

U.S. PATENT DOCUMENTS

| 3,012,865 A | | 12/1961 | Pellin |
| 3,841,845 A | | 10/1974 | Keller |
| 4,203,951 A | * | 5/1980 | Goriletsky et al. ........... 117/213 |
| 4,242,307 A | * | 12/1980 | Fally ............................. 422/604 |
| 4,512,954 A | * | 4/1985 | Matsui ......................... 117/202 |
| 4,565,671 A | * | 1/1986 | Matsutani et al. ............ 117/217 |

(Continued)

FOREIGN PATENT DOCUMENTS

| DE | 3411955 A1 | 10/1985 |
| EP | 0867405 A1 | 9/1998 |

(Continued)

OTHER PUBLICATIONS

"European Application Serial No. 08796655.2, Office Action mailed Mar. 1, 2011", 3 Pgs.

(Continued)

*Primary Examiner* — Anthony J Zimmer
(74) *Attorney, Agent, or Firm* — Schwegman Lundberg & Woessner, P.A.

(57) ABSTRACT

Techniques for the formation of a silicon ingot using a low-grade silicon feedstock include forming within a crucible device a molten silicon from a low-grade silicon feedstock and performing a directional solidification of the molten silicon to form a silicon ingot within the crucible device. The directional solidification forms a generally solidified quantity of silicon and a generally molten quantity of silicon. The method and system include removing from the crucible device at least a portion of the generally molten quantity of silicon while retaining within the crucible device the generally solidified quantity of silicon. Controlling the directional solidification of the generally solidified quantity of silicon, while removing the more contaminated molten silicon, results in a silicon ingot possessing a generally higher grade of silicon than the low-grade silicon feedstock.

14 Claims, 7 Drawing Sheets

(56) References Cited

U.S. PATENT DOCUMENTS

| | | | |
|---|---|---|---|
| 4,871,517 A | | 10/1989 | Falckenberg et al. |
| 5,314,667 A | * | 5/1994 | Lim et al. .................. 117/213 |
| 5,580,171 A | * | 12/1996 | Lim et al. .................. 366/336 |
| 5,961,944 A | | 10/1999 | Aratani et al. |
| 6,136,091 A | | 10/2000 | Yamazaki et al. |
| 6,231,826 B1 | | 5/2001 | Hanazawa et al. |
| 6,605,152 B2 | * | 8/2003 | Mizuishi et al. ............. 117/213 |
| 6,755,910 B2 | * | 6/2004 | Morita et al. ................. 117/13 |
| 7,635,414 B2 | * | 12/2009 | Bender ........................ 117/217 |
| 7,955,433 B2 | | 6/2011 | Kirscht |
| 8,226,903 B2 | * | 7/2012 | Kellerman et al. ........... 422/270 |
| 8,262,797 B1 | * | 9/2012 | Bender et al. ................ 117/217 |
| 8,317,919 B2 | * | 11/2012 | Bender ........................ 117/214 |
| 8,475,591 B2 | * | 7/2013 | Kellerman et al. ............. 117/26 |
| 8,652,257 B2 | * | 2/2014 | Eidelman et al. ............. 117/214 |
| 2005/0066881 A1 | * | 3/2005 | Nakagawa et al. ............ 117/18 |
| 2005/0139148 A1 | | 6/2005 | Fujiwara et al. |
| 2006/0048698 A1 | | 3/2006 | Hall et al. |
| 2007/0077191 A1 | | 4/2007 | Yamauchi et al. |
| 2009/0028773 A1 | | 1/2009 | Kirscht et al. |

FOREIGN PATENT DOCUMENTS

| | | | | |
|---|---|---|---|---|
| EP | 1154047 A1 | 11/2001 | | |
| EP | 2179078 B1 | 3/2012 | | |
| JP | 2004161575 A | 6/2004 | | |
| JP | 2007063048 A | 3/2007 | | |
| WO | WO 86/06109 | * | 10/1986 | ............. C30B 15/04 |
| WO | WO-2009015356 A1 | 1/2009 | | |

OTHER PUBLICATIONS

"European Application Serial No. 08796655.2, Response filed Jun. 15, 2011 to Office Action mailed Mar. 1, 2011", 15 pgs.

"U.S. Appl. No. 11/828,734, Non Final Office Action mailed Jul. 2, 2010", 8 pgs.

"U.S. Appl. No. 11/828,734, Notice of Allowance mailed Nov. 22, 2010", 9 pgs.

"U.S. Appl. No. 11/828,734, Response filed May 3, 2010 to Restriction Requirement mailed Apr. 1, 2010", 4 pgs.

"U.S. Appl. No. 11/828,734, Response filed Sep. 2, 2010 to Non Final Office Action mailed Jul. 21, 2010", 18 pgs.

"U.S. Appl. No. 11/828,734, Restriction Requirement mailed Apr. 1, 2010", 6 pgs.

"European Application Serial No. 08796655.2, European Extended Search Report mailed Jul. 6, 2010", 7 Pgs.

"Chinese Application Serial No. 200880109607.6, Office Action mailed Feb. 2, 2012", w/ English Translation of Form, 7 pgs.

"Chinese Application Serial No. 200880109607.6, Response filed May 31, 2012 to Office Action mailed Feb. 2, 2012", 17 pgs.

* cited by examiner

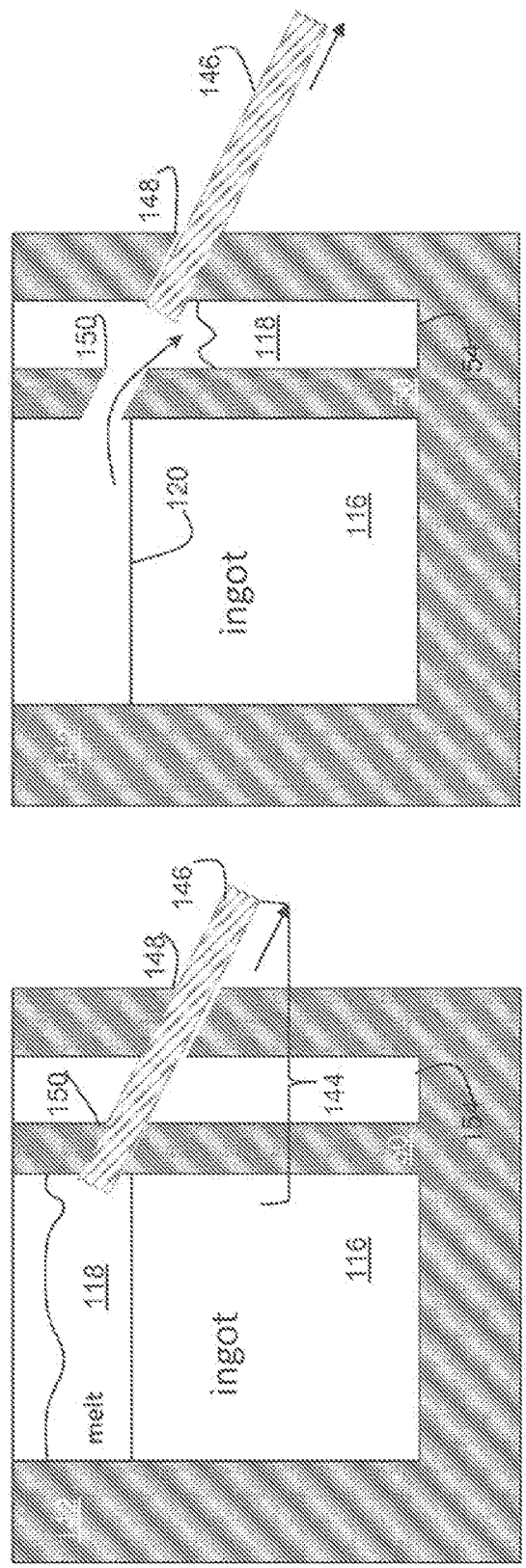

METHOD AND SYSTEM FOR FORMING A SILICON INGOT USING A LOW-GRADE SILICON FEEDSTOCK

FIELD

The present disclosure relates to methods and systems for use in the fabrication of semiconductor materials such as silicon. More particularly, the present disclosure relates to a method and system for forming a higher purity semiconductor ingot using low purity semiconductor feedstock.

DESCRIPTION OF THE RELATED ART

The photovoltaic industry (PV) industry is growing rapidly and is responsible for an increasing amount of silicon being consumed beyond the more traditional uses as integrated circuit (IC) applications. Today, the silicon needs of the solar cell industry are starting to compete with the silicon needs of the IC industry. With present manufacturing technologies, both integrated circuit (IC) and solar cell industries require a refined, purified, silicon feedstock as a starting material.

Materials alternatives for solar cells range from single-crystal, electronic-grade (EG) silicon to relatively dirty, metallurgical-grade (MG) silicon. EG silicon yields solar cells having efficiencies close to the theoretical limit (but at a prohibitive price), while MG silicon typically fails to produce working solar cells. Early solar cells made from polycrystalline silicon achieved relatively low efficiencies near 6%. Efficiency is a measure of the fraction of the energy incident upon the cell to that collected and converted into electric current. However, there may be other semiconductor materials that could be useful for solar cell fabrication.

Cells commercially available today at 24% efficiencies are made possible by higher purity materials and improved processing techniques. These engineering advances have helped the industry approach the theoretical limit for single junction silicon solar cell efficiencies of 31%. In practice nearly 90% of commercial solar cells are made of crystalline silicon.

Several factors determine the quality of raw silicon material that may be useful for solar cell fabrication. These factors may include, for example, transition metal and dopant content and distribution. Transition metals pose a principal challenge to the efficiency of multicrystalline silicon solar cells. Multicrystalline silicon solar cells may tolerate transition metals such as iron (Fe), copper (Cu), or nickel (Ni) in concentrations up to $10^{16}$ $cm^{-3}$, because metals in multicrystalline silicon are often found in less electrically active inclusions or precipitates, often located at structural defects (e.g., grain boundaries) rather than being atomically dissolved.

Low-grade feedstock materials for the PV industry, such as upgraded metallurgical (UMG) silicon, are typically processed into ingots and wafers of multicrystalline (mc) Si with correspondingly low quality. This low quality is controlled by a high concentration of impurities that ultimately degrade solar cell characteristics. Degradation can be particularly severe if impurities interact with structural defects characteristic of mc-Si. In this respect, one of the most harmful defects are intra-granular dislocations which are mainly introduced at uncontrolled stress relief in the cooling phase of crystallization.

Non-metallic impurities including carbon (C) and dopants (mostly B and P) are extracted using a variety of cleaning technologies, such as blowing reactive gases through molten Si. Typically, a combination of several cleaning steps/technologies is applied to reach an acceptable quality level of mc-Si after crystallization. Since cost adds up with adding cleaning steps there is the desire to use as low-quality material as possible. As a result, there are feedstock materials that often contain very high amounts of C or/and P. If the concentration of C exceeds solubility at crystallization, silicon carbide (SiC) precipitates form in respective crystals/ingots and SiC degrades heavily respective mc-Si materials.

Metallic impurities are heavily enriched towards the end of crystallization. If directional solidification starts at the bottom of a Si melt, as in the case of e.g. Bridgman casting, the solidifying mc-Si becomes badly contaminated at the top of respective ingots. Since most of the quality-degrading metals in Si are relatively fast diffusers in crystalline Si, those metals can partially diffuse back into the solidified Si during ingot cooling, leading to additional degradation of deeper parts of respective ingots. This makes it impossible to use extended ramp-down for in-situ ingot annealing, at least in the temperature range beyond approx. 1050° C. (where metals diffusion is especially fast). On the other hand, this temperature range is potentially useful for in-situ annealing to improve the crystalline structure and reduce frozen-in stress in mc-Si ingots.

If the process continues through to the complete solidification of the silicon melt, then the metal impurities diffuse back into the silicon ingot. Without the diffusion, the silicon ingot would be of a higher purity. The result of such back diffusion becomes a quantity of silicon in the ingot that is not usable, but which would have been usable had the back diffusion not occurred. Presently, no known process adequately addresses this problem.

Accordingly, a need exists for a source of silicon ingots to meet the silicon needs of the solar cell industry, which source may not compete with the demands of the IC industry.

A need exists for providing silicon ingots that may ultimately form commercially available solar cells with efficiencies presently achievable using expensive higher purity materials and/or costly processing techniques.

A further need exists for a process capable of yielding a higher quality silicon ingot using a low-grade silicon feedstock achieving a general cost reduction. Still a need exists for a method and system that both economically and effectively addresses the problem of impurity back diffusion in the final stages of silicon ingot formation.

SUMMARY

Techniques are here disclosed for formation of a silicon ingot which may be useful for ultimately making solar cells. The present disclosure includes a method and system for, and a resulting silicon ingot including higher purity semiconductor material using lower purity semiconductor feedstock. For example, using silicon ingots formed from the processes here disclosed, solar wafers and solar cells with improved performance/cost ratio are practical. In addition, the present disclosure may readily and efficiently combine with metal-related defect removal and modification processes at the wafer level to yield a highly efficient PV solar cell.

According to one aspect of the disclosed subject matter, a semiconductor ingot forming method and associated system are provided for using a low-grade silicon feedstock that includes forming within a crucible device a molten silicon from a low-grade silicon feedstock. The process and system perform a directional solidification of the molten silicon to form a silicon ingot within the crucible device. The directional solidification forms a generally solidified quantity of silicon and a generally molten quantity of silicon. The method and system include removing from the crucible device at least a portion of the generally molten quantity of silicon while retaining within the crucible device the generally solidified quantity of silicon. The process and system further control the directional solidification of the generally solidified quantity of silicon to form a silicon ingot possessing a generally higher grade of silicon than the low-grade silicon feedstock. A variety of pathways for removing the more contaminated molten silicon are here disclosed.

These and other advantages of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages be included within this description, be within the scope of the accompanying claims.

BRIEF DESCRIPTIONS OF THE DRAWINGS

The features, nature, and advantages of the disclosed subject matter may become more apparent from the detailed description set forth below when taken in conjunction with the drawings in which like reference characters identify correspondingly throughout and wherein:

FIG. 1 is a prior art flow diagram depicting generally the known processes for forming a solar cell;

FIG. 2, in contrast, shows generally an overall solar cell formation process that may incorporate the teachings of the disclosed subject matter;

Figure 5:
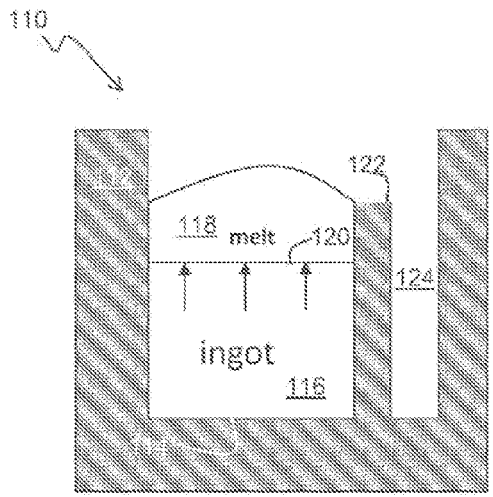
Figure 6:
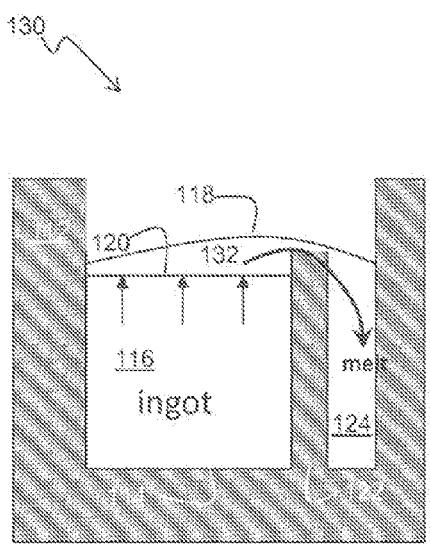
Figure 7:
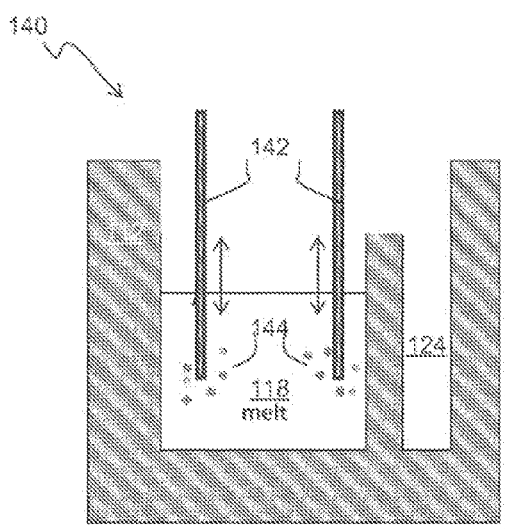
Figure 8:
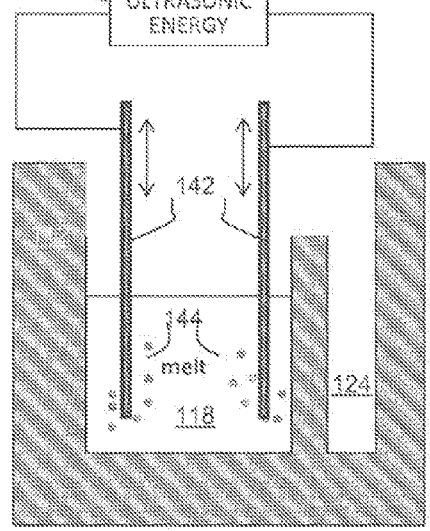
Figure 9:
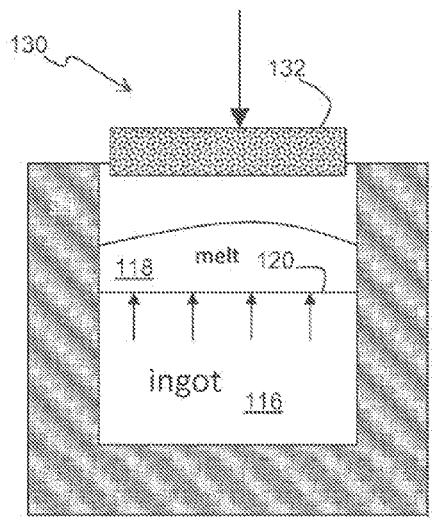
Figure 10:
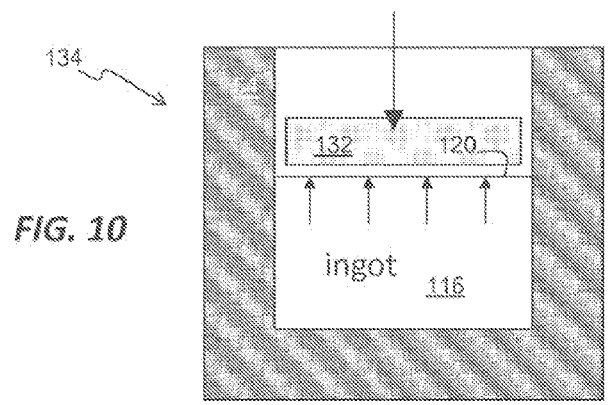
Figure 11:
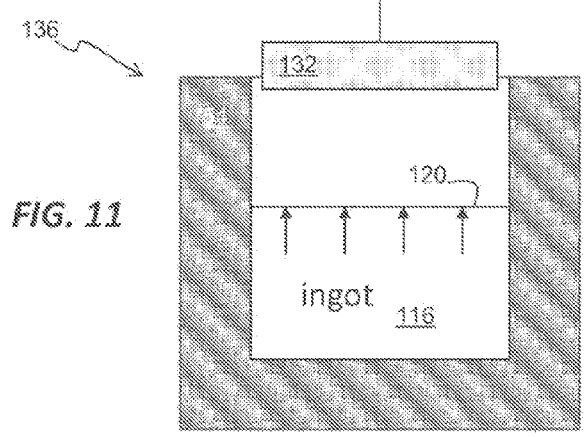
Figure 14:
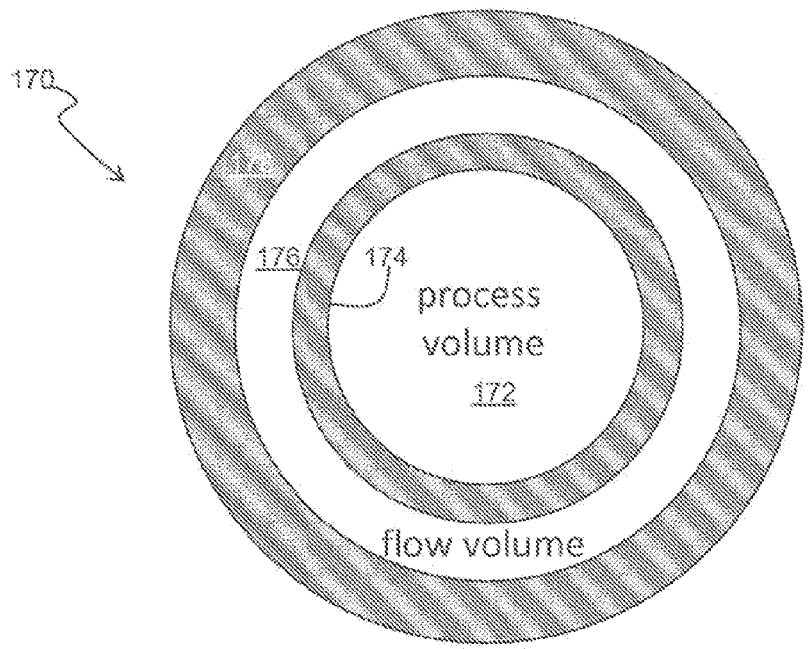
Figure 15:
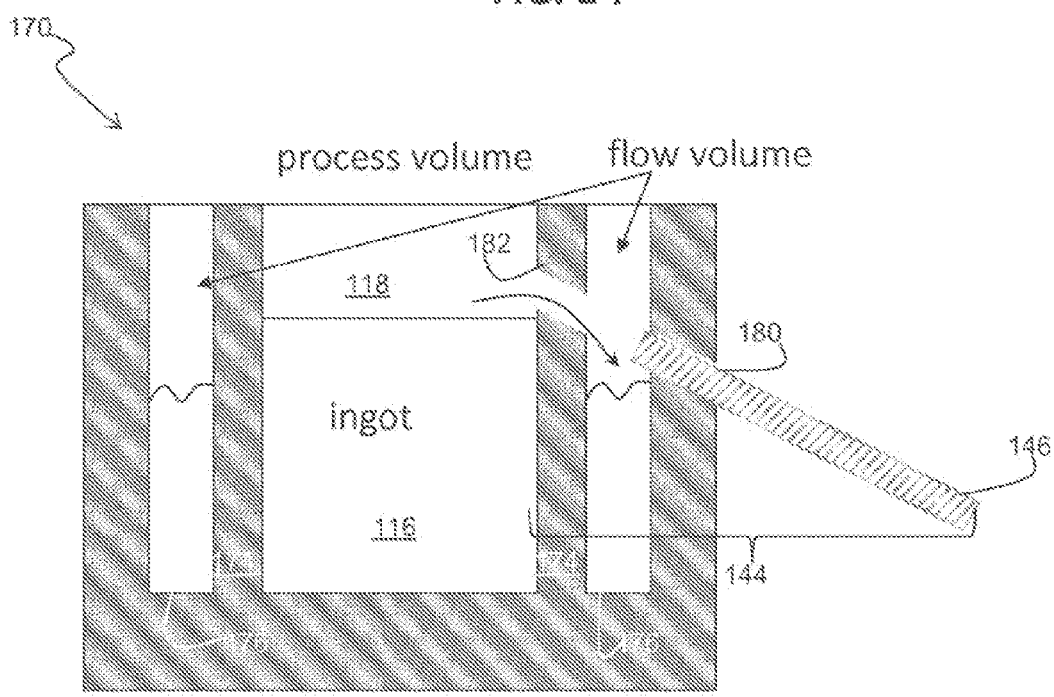

FIGS. 5 and 6 present an embodiment a molten silicon removal process as disclosed by the present subject matter;

FIGS. 7 and 8 illustrate various forms of molten silicon pre-conditioning as may be application to the present disclosure;

FIGS. 9 through 11 an alternative embodiment silicon removal process applicable to the present disclosure;

FIGS. 12 and 13 exhibit a further alternative embodiment silicon removal process within the scope of the present disclosure; and FIGS. 14 and 15 provide different aspects of a crucible device that may find application within the subject matter of the present disclosure.

DETAILED DESCRIPTION OF THE SPECIFIC EMBODIMENTS

The method and system of the present disclosure provide a semiconductor ingot formation process for producing a higher purity silicon or semiconductor ingot using a low purity or high impurity silicon or semiconductor feedstock. The presently disclosed process saves one melting process by combining previously separately performed processing steps, as well as making better use of the inherent cooling phase in the silicon ingot formation process. The present disclosure includes a pathway for removing molten silicon to leave the silicon ingot while the ingot formation takes place. The molten silicon that the disclosed subject matter removes generally possesses a larger amount of impurities than the silicon ingot being formed.

Removing the more contaminated silicon melt avoids back-contamination by metal impurities into the already formed silicon ingot. Without the concern for back-diffusion of such impurities, even further silicon ingot process control and improvements are possible. For example, there is the possibility to hold an ingot at an elevated temperature to avoid the stresses that would otherwise exist in a system not capable of avoiding the back diffusion of metal impurities. Along with stress reduction goes reduced stress-related formation of structural defects in respective ingots, leading to further enhancement of ingot quality.

The ultimate advantage is reduction of total cost since lower-grade feedstock can be used for directional solidification of a silicon ingot. Ingots made by the presently disclosed process and system are of higher quality as compared to ingots produced by known directional solidification techniques using lower purity feedstock. Among various technical advantages and achievements herein described, certain ones of particular note include the ability to reduce the amount of metallic and non-metallic impurities present in a semiconductor ingot such as may be useful in solar cell fabrication. Another specific advantage is avoidance of high-concentration regions of non-metals, mainly B, P and C, in top regions of ingots made from UMG-Si feedstock materials.

Figure 1:
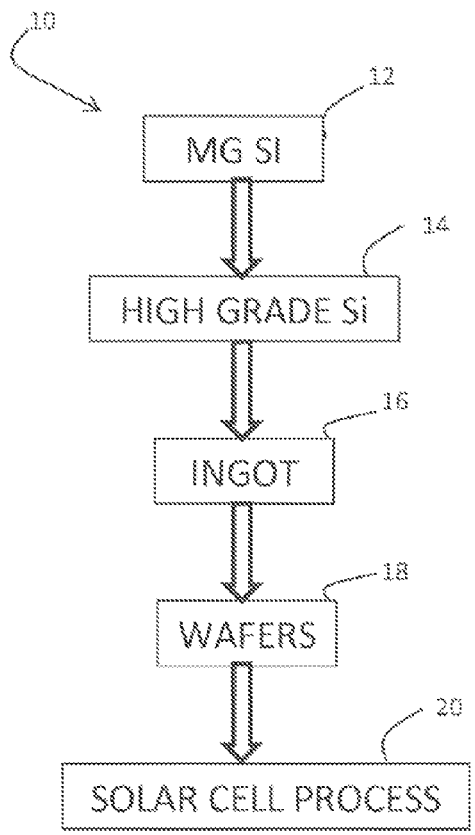

Laying a context for the present disclosure, FIG. 1 depicts a known process 10 beginning at step 12. At step 12, MG or other low-grade silicon enters known wafer forming process flow 10. Known process flow 10 extracts high-grade silicon from MG silicon at step 14. High-grade silicon extraction step 14 is a high-cost processing sequence resulting in EG silicon. This is the type of silicon feedstock material used for making the ingot in step 16. Known process flow 10 includes slicing the silicon ingot, generally using a wire-saw to derive a silicon wafer at step 18. The resulting silicon wafers then enter solar cell formation process 20.

Figure 2:
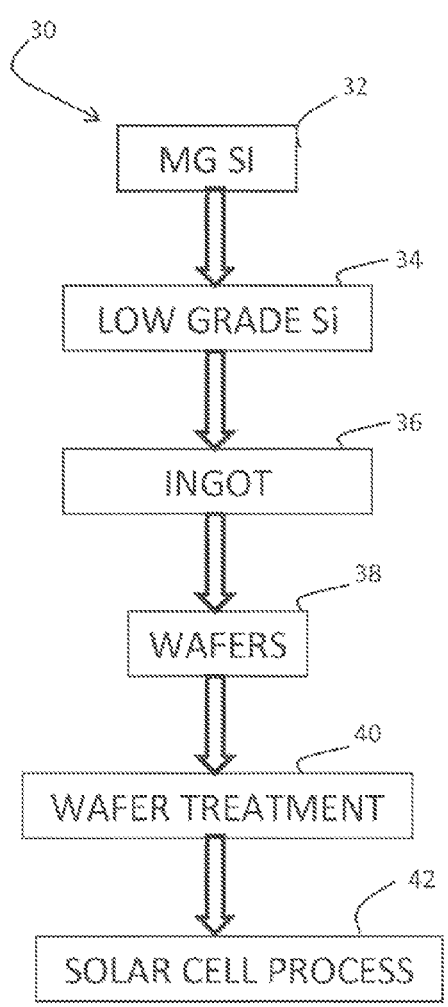

FIG. 2 depicts, in general terms, novel aspects of a solar cell forming process flow 30 wherein the present disclosure exhibits particular advantages. Process flow 30 includes using MG silicon at steps 32 that is purified to some degree to become BMG or UMG silicon. The silicon quality reached is still a low-grade silicon 34. Accordingly, silicon quality 36 relates to much lower cost as compared to silicon quality 14. Also, low-grade silicon at step 36 possesses a higher content of metallic and other impurities as compared to silicon quality 14. At step 38, silicon ingot formation may occur. Step 40 represents the formation of silicon wafers, i.e., slicing from the silicon ingot. The disclosed solar cell forming process flow 30 may introduce a wafer treatment step 40, also called pre-process step, before starting the cell process. Finally, the solar cell forming process occurs at step 42.

Figure 3:
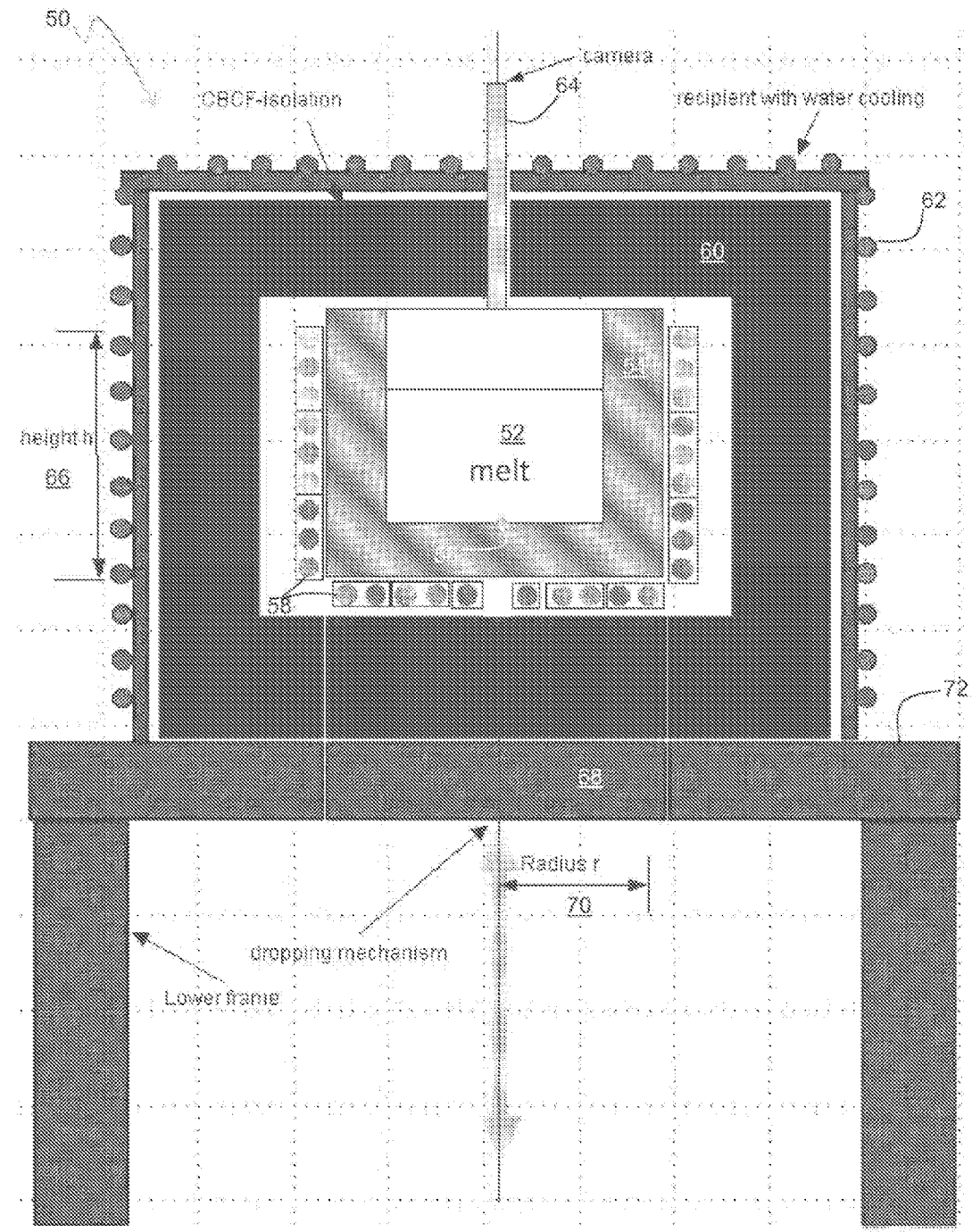
FIG. 3 illustrates one embodiment of a process environment in which to achieve the results of the present disclosure.

At steps 34 and 36 of process flow 30, the teachings of the disclosed subject matter affect the formation of a silicon ingot. For the purpose of specifying a process environment in which to apply the teachings of the present disclosure, FIG. 3 illustrates process environment 50. In FIG. 3, crucible 54 contains silicon melt 52. Heating zones 58 surround the sides and bottom of crucible 54. Isolation chamber 60 further establishes a process environment in conjunction with crucible 54 for temperature control and to establish a process atmosphere. Water cooling system 62 surrounds isolation chamber 60, which camera 64 may penetrate to allow observation of the silicon melt 52.

Process environment 50 has a height 66, which crucible 54 spans vertically. However, for enhanced process control dropping mechanism 68, which has a radius 70 may move vertically downward within lower frame 72 to expose different portions of crucible 54 to different temperature heating zones 58 more rapidly or at in more varying ways that can direct heating zone control. Processing environment 50 provides a sealed growth chamber having a vacuum of, for example, below 1×10⁻³ Torr and cycle purged with argon to 10 psig several times to expel any oxygen remaining in the chamber. Heating zones 58 may be heated by a multi-turn induction coil in a parallel circuit with a tuning capacitor bank.

Figure 4:
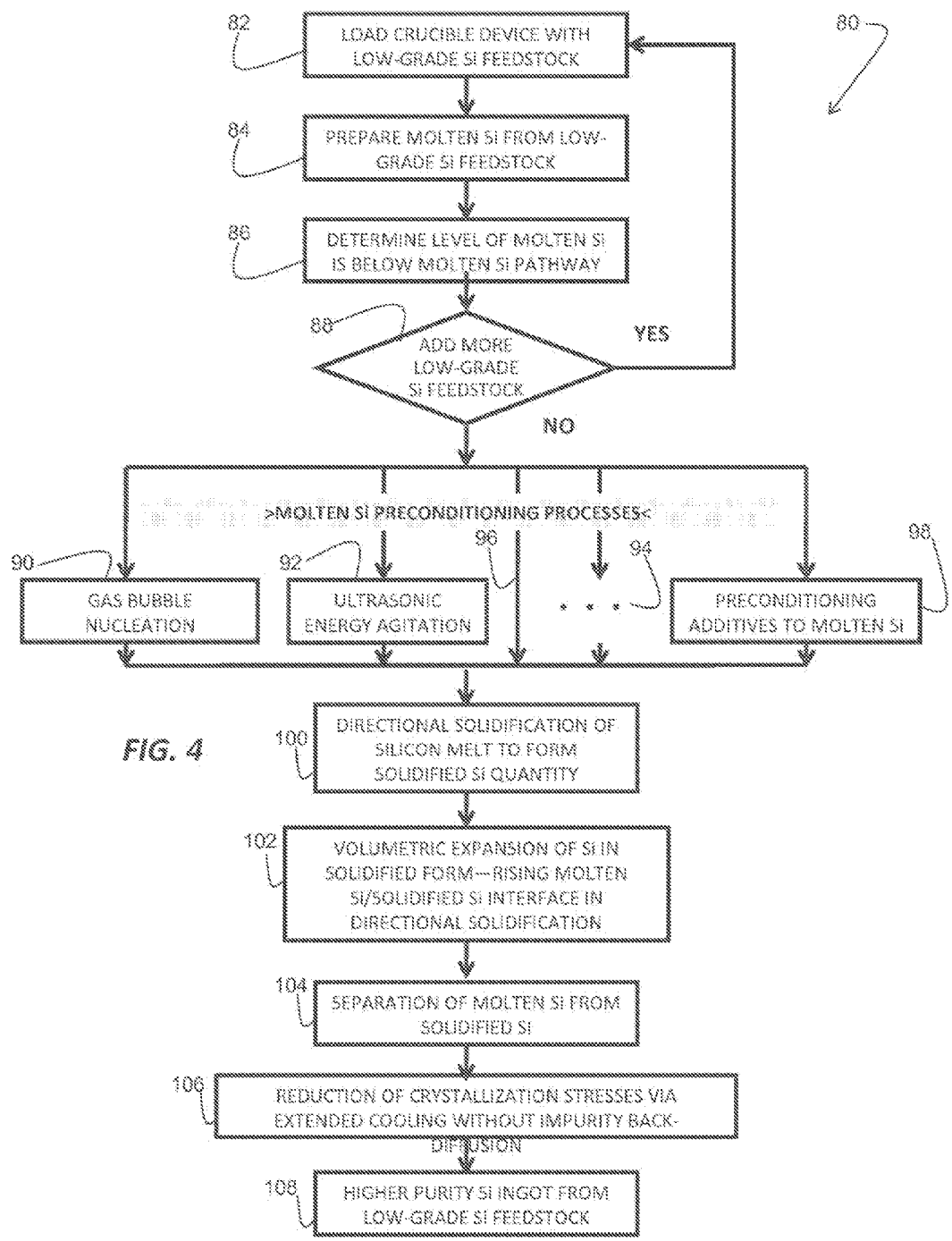
FIG. 4 shows a process flow according to the present disclosure for a higher purity silicon ingot from a low-grade silicon feedstock.

FIG. 4 presents an exemplary flowchart 80 for the presently disclosed silicon ingot formation process. Beginning at step 82, silicon ingot forming process 80 loads a crucible, such as crucible 54 or the various crucible embodiments disclosed below, with low-grade silicon feedstock. At step 84 molten silicon forms from the low-grade silicon feedstock by virtue of a heating process. Once a discernable amount of silicon melt forms in the crucible, a determination of whether the silicon melt forms below a predetermined pathway for its removal occurs at step 86. If so, a next test 88 determines whether there is the need to add more low-grade silicon feedstock to the crucible.

In essence, this determination is to assure that, as the directional solidification of the silicon melt 52 forms a higher grade silicon ingot, the progressively contaminated silicon melt ultimately has a path for its removal in the molten state. By removing contaminated silicon melt 52 while in the molten state, it is possible to prevent the back-diffusion of the contaminants into the higher purity silicon ingot, as will be described in more detail below.

Now, once a sufficient amount of low-grade silicon feedstock, and, therefore, silicon melt 52 exists within crucible 54, an optional process or set of processes preconditioning silicon melt 52 may occur. Such preconditioning steps may include one or a combination of the steps for extracting impurities deriving from the low-grade silicon.

The various silicon melt preconditioning steps may include a gas bubble nucleation step 90, an ultrasonic energy agitation step 92, or a combination of such steps or further steps including electromagnetic energy transfer to the melt, such as ellipsis 94 depicts. Moreover, as arrow 96 suggests, such steps may be bypassed. As step 98 further shows, such preconditioning may include a step of including various additives to silicon melt 52.

Next, the process of the present disclosure includes initiation of directional solidification of silicon melt 52 to begin silicon ingot formation, at step 100. As the directional solidification of the melt forms the silicon ingot, a phase transformation of the silicon from liquid to solid occurs. Due to the phase transformation, expansion of the silicon volume within crucible 54 occurs, increasing the level of now combined molten and solidified silicon, as step 102 depicts. As the silicon level within the crucible continues to increase, a separation of the molten silicon takes place. This separation occurs due to the physical characteristics of one or more embodiments of crucible 52 as shown and described in greater detail below.

With the separation of molten silicon from crystallized silicon, as step 104 indicates, the silicon that remains in crucible 52 is of a higher purity than the silicon feedstock from which the silicon melt forms. The extraction of the silicon melt takes with it a higher concentration of impurities. The result is, in essence, the elimination or substantial reduction in the likelihood that impurities from the silicon melt 52 will back diffuse into the silicon ingot.

Because of the reduced likelihood of impurity back diffusion, step 106 may occur. At step 106, ingot formation process 80 reduces crystallization stresses that arise within a silicon ingot during more rapid cooling processes. A lower concern for impurity back diffusion during a slower cooling process, allows for controlling the rate of crystallized silicon cooling so as to relieve crystallization stresses. The reduced crystallization stress in the resulting silicon ingot yet further yields a higher purity silicon ingot, as step 108 shows.

FIGS. 5 and 6 show in more detail aspects of step 102 of process flow 80, wherein volumetric expansion of silicon in the solid or crystallizing form facilitates the removal of the increasingly contaminated silicon melt. In FIG. 5 appears process state 110, which includes a crucible 112 that provides a pathway for the silicon melt removal. Crucible 112 contains in process volume 114 both silicon ingot portion 116 and silicon melt 118. Interface 120 separates silicon ingot portion 116 from silicon melt 118. Crucible 112 further contains interstitial wall 122 separating process volume 114 from silicon melt flow volume 124.

FIG. 6 shows the progressive raising of interface 120 at state 130 of silicon ingot formation process 80. Thus, as the volumetric expansion of the solidified silicon 116 occurs, both the rising level of interface 120 and the increasing contamination of silicon melt 118 takes place. The effect is raise silicon melt at and above the lower height of interstitial wall 122. That is, the lower height of interstitial wall 122 forms a pathway 132 for the removal of silicon melt 118. As will be shown below, pathway 132 may be formed in numerous ways. However, the embodiment of FIGS. 5 and 6 show one desirable, yet ingeniously simple way to cause the removal of silicon melt 118 from the ingot formation process volume 114 of crucible 112.

To make more clear how the presently disclosed process may precondition silicon melt 118, FIGS. 7 and 8 show, respectively, the use of bubble nucleation and the combination of bubble nucleation and ultrasonic energy agitation for the purpose of facilitating the extraction of impurities during the early stages of directional silicon solidification. Referring, therefore, to FIG. 7, process state 140, wherein gas tubes 142 may be inserted into silicon melt 118. Silicon melt 118 may receive through gas tubes certain amounts of gases such as oxygen, nitrogen, hydrogen, water vapor, $CO_2$ or Chlorine-containing gases such as HCl or combinations of the above gases and other gases. These gases react with impurities dissolved in the silicon melt 118 and form volatile compounds which evaporate from the melt. This can result in a more pure silicon ingot portion 116 (FIG. 5) during subsequent directional solidification step 100 of silicon ingot formation process 80.

FIG. 8 shows in state 150 one embodiment of a silicon melt 118 precondition step 92, wherein an ultrasonic energy source 152 may connect with gas tubes 142. That is, gas tubes 142 may not only serve as a conduit for delivery of nucleation bubbles 144, but may also serve as an ultrasonic energy path for transmitting energy from ultrasonic energy source 152 into silicon melt 118. Here, too, the preconditioning of silicon melt 118 promotes a more pure resulting silicon melt portion 116 by extracting impurities deriving from the low-grade silicon.

FIGS. 9 through 11 expand the concept of a pathway for the removal of the contaminated silicon melt. In particular, FIG. 9 shows that, in conjunction with a crucible, such as crucible 54, there may be a silicon ingot portion 116 and a silicon melt 118 with interface 120. Since, as has been explained, with the growth of silicon ingot portion 116, impurities have concentrated in silicon melt 118. The embodiment of FIG. 9 demonstrates one path for removing the contaminated silicon melt 188.

FIGS. 9 through 11 shows process stage 130 in which porous felt device 132 provides a material that demonstrates a significantly higher melting temperature than that of silicon melt 118. By lowering porous felt device 112 into silicon melt 118, absorption of silicon melt 118 occurs. FIG. 10, therefore, demonstrates in process stage 134 that porous felt device 132 has absorbed a significant portion, if not all of silicon melt 118, thereby permitting the removal of contaminated silicon melt 118 from crucible 54. FIG. 11 shows in process stage 136 the removal of porous felt device 122 from crucible 54, taking with it contaminated silicon melt 118.

FIGS. 12 and 13 depict a further embodiment of the present disclosure wherein the pathway for removal of silicon melt 118 includes a movable flow valve device. In particular, FIG. 12 depicts a process state 140 for a crucible 142 embodiment that includes a two-part flow valve assembly 144. Flow-valve assembly 144 includes valve stem 146, which penetrates through crucible outer aperture 148 and inner aperture 150 of interstitial wall 152. When inserted through both outer aperture 148 and inner aperture 150, valve stem 146 maintains an empty silicon melt 118 flow volume 154.

As silicon ingot portion 116 forms, silicon melt 118 develops within crucible process volume 152 above both interface 120 and inner aperture 150. Once silicon ingot portion reaches approximately the level of inner aperture 150, valve stem 146 may be withdrawn through inner aperture 150.

FIG. 13 shows in process state 160 that by withdrawing valve stem 146 from inner aperture 150, while maintain valve stem 146 within outer aperture 148 a pathway for silicon melt 118 to flow into flow volume 154. The flow of silicon melt 118 through the pathway of inner aperture 150 and into flow volume 154 removes from process volume 152 the contaminated silicon melt 118, thereby preventing a significant degree of back diffusion of contaminants in a subsequent processing steps.

Now, there may be various embodiments of one or more crucibles that provide the pathway such as described in the above FIGUREs. Thus, in addition to the above-described crucibles, FIGS. 14 and 15 demonstrate yet a further embodiment of a crucible device 170 that is suitable for achieving the purposes of the present disclosure. In particular, crucible device 170 may include process volume 172 for receiving a low-grade silicon feedstock and producing there from silicon ingot portion Inner wall 174 may surround process volume 172. Flow volume 176 surrounds inner wall 174, and outer wall 178 surrounds flow volume 176.

FIG. 15 further depicts crucible device 170 to include flow-valve assembly 144 having, as described above, valve stem 146, which penetrates through flow volume outer aperture 180 of outer wall 178 and process environment 172 inner aperture 182. Operation flow-valve assembly 144 is as described above, with the distinction that with flow volume 176 surrounding inner wall 174, withdrawal of valve stem 146 causes silicon melt 118 to surround inner wall 174.

In summary, the disclosed subject matter provides a method and system for forming a silicon ingot which includes forming within a crucible device a molten silicon from a low-grade silicon feedstock and performing a directional solidification of the molten silicon to form a silicon ingot within the crucible device. The directional solidification forms a generally solidified quantity of silicon and a generally molten quantity of silicon. The method and system include removing from the crucible device at least a portion of the generally molten quantity of silicon while retaining within the crucible device the generally solidified quantity of silicon. Controlling the directional solidification of the generally solidified quantity of silicon forms a silicon ingot possessing a generally higher grade of silicon than the low-grade silicon feedstock. Such control may include extending the duration of the directional solidification of the generally solidified quantity of silicon for reducing material stresses arising from the crystallization of the silicon ingot.

The method and system may pre-condition the molten silicon for extracting impurities deriving from the low-grade silicon, such as by introducing bubble nucleation into the molten silicon, transmitting ultrasonic energy or electromagnetic energy into the molten silicon and combining with the molten silicon an additive for aiding in the extraction of the impurities from the molten silicon.

Various embodiments of the present disclosure include removing from the crucible device at least a portion of the generally molten quantity of silicon by flowing the generally molten quantity of silicon via a pathway associated with the crucible device. Embodiments of the pathway may include a lower interstitial wall separating a first volume of the crucible device from a second volume of the crucible device, the first volume of the crucible device containing the generally solidified quantity of silicon and the generally molten quantity of silicon. In such embodiment, the lower interstitial wall further having a height approximating a height of a predetermined interface level between the generally solidified quantity of silicon and the generally molten quantity of silicon at a predetermined point during the directional solidification. The lower interstitial wall permits at least a portion of the generally molten quantity of silicon to flow from the first volume of the crucible device to the second volume of the crucible device, thereby separating the portion of the generally molten quantity of silicon from the generally solidified quantity of silicon.

Another embodiment flows a portion of the generally molten quantity of silicon into the second volume surrounding the first volume. Another pathway may include a felt device for absorbing the generally molten quantity of silicon that may be submersed into the generally molten quantity of silicon. The molten silicon is absorbed into the felt device and removed to take with it the absorbed portion of the generally molten silicon. The pathway comprises a drain conduit and a plug device associated to control flow of the generally molten quantity of silicon through the drain conduit and further comprising the step of controllably positioning the plug device for controlling flow of the generally molten quantity of silicon from the crucible device. The method disassociates the generally molten quantity of silicon from the generally solidified quantity of silicon.

Still another embodiment of the present disclosure provides a drain conduit separating a first volume of the crucible device from a second volume of the crucible device. A plug device associates to control flow of the generally molten quantity of silicon through the drain conduit. The process further controllably positions the plug device for controlling flow of molten silicon from the first volume to the second volume for disassociating the molten silicon from silicon. The second volume may surround the first volume.

As a result of using the presently disclosed subject matter, an improvement in the properties of low-grade semiconductor materials, such as upgraded metallurgical-grade silicon (UMG) occurs. Such improvement allows use of UMG silicon, for example, in producing solar cells as may be used in solar power generation and related uses. The method and system of the present disclosure, moreover, particularly benefits the formation of semiconductor solar cells using UMG or other non-electronic grade semiconductor materials. The present disclosure may allow the formation of solar cells in greater quantities and in a greater number of fabrication facilities than has heretofore been possible.

The process and system features and functions described herein, therefore, form a higher purity silicon ingot from lower purity silicon feedstock. Although various embodiments which incorporate the teachings of the present disclosure have been shown and described in detail herein, those skilled in the art may readily devise many other varied embodiments that still incorporate these teachings. The foregoing description of the preferred embodiments, therefore, is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein, but is to be accorded the widest scope consistent with the principles and novel features disclosed herein.

What is claimed is:

1. A system for forming a silicon ingot using a low-grade silicon feedstock, said silicon ingot comprising higher grade silicon than said low-grade silicon feedstock, comprising:
    a crucible device for receiving and heating a low-grade silicon feedstock and for forming a molten silicon in response to the heating;
    temperature control means for performing a directional solidification of the molten silicon to form a silicon ingot within the crucible device, the temperature control means configured to form the silicon ingot from the bottom of the crucible device toward the top to form a solidified quantity of silicon and a molten quantity of silicon on top of the solidified quantity of silicon, wherein the temperature control means is configured so that the directional solidification increases the height of the combined solidified quantity of silicon and the molten quantity of silicon within the crucible device;
    a pathway associated with the crucible device for removing from the crucible device at least a portion of the molten quantity of silicon while retaining within the crucible device the solidified quantity of silicon by flowing at least the portion of the molten quantity of silicon from the crucible device via the pathway, wherein the pathway is positioned at a height so that the increase in height due to the directional solidification allows at least the portion of the molten quantity of silicon to reach the height of the pathway.

2. The system of claim 1, further comprising means for pre-conditioning the molten silicon for extracting impurities from the low-grade silicon.

3. The system of claim 1, further comprising a bubble nucleation source associated with the crucible device for pre-conditioning the molten silicon by introducing bubble nucleation into the molten silicon.

4. The system of claim 1, further comprising a bubble nucleation source for introducing gas bubble nucleation into the molten silicon using gases selected from the group consisting of oxygen, nitrogen, hydrogen, water vapor, carbon dioxide and chlorine-containing gases.

5. The system of claim 1, further comprising an ultrasonic energy source associated with the crucible device for transmitting ultrasonic energy into the molten silicon for enhancing the extraction of impurities from the molten silicon.

6. The system of claim 1, further comprising a means for adding an additive to the molten silicon for aiding in the extraction of the impurities from the molten silicon.

7. The system of claim 1, wherein the temperature control means is configured to control the duration of the directional solidification to reduce material stresses arising from the crystallization of the silicon ingot.

8. The system of claim 1, wherein the pathway comprises a lower interstitial wall separating a first volume of the crucible device from a second volume of the crucible device,
    the first volume of the crucible device containing the solidified quantity of silicon and the molten quantity of silicon;
    the lower interstitial wall further having a height approximating a height of a predetermined interface level between the solidified quantity of silicon and the molten quantity of silicon at a predetermined point during the directional solidification; and
    the lower interstitial wall permitting at least the portion of the molten quantity of silicon to flow from the first volume of the crucible device to the second volume of the crucible device, thereby separating at least the portion of the molten quantity of silicon from the solidified quantity of silicon.

9. The system of claim 8, wherein the second volume surrounds the first volume for flowing at least the portion of the molten quantity of silicon into the second volume surrounding the first volume.

10. The system of claim 1, said pathway comprising:
    a felt device for absorbing at least the portion of the molten quantity of silicon means for positioning the felt device into the portion of the molten quantity of silicon; and
    means for removing the felt device including the absorbed portion of the molten quantity of silicon from the crucible device.

11. The system of claim 1, wherein the pathway comprises a drain conduit and a plug device associated to control flow of the molten quantity of silicon through the drain conduit for controllably positioning the plug device, thereby controlling flow of the molten quantity of silicon from the crucible device and disassociating at least the portion of the molten quantity of silicon from the solidified quantity of silicon.

12. The system of claim 1, wherein the pathway comprises a drain conduit separating a first volume of the crucible device from a second volume of the crucible device, and a plug device to control flow of the molten quantity of silicon through the drain conduit for controlling flow of the molten quantity of silicon from the first volume to the second volume, thereby disassociating at least the portion of the molten quantity of silicon from the solidified quantity of silicon.

13. The system of claim 12, wherein the second volume surrounds the first volume for flowing at least the portion of the molten quantity of silicon into the second volume surrounding the first volume.

14. The system of claim 1, wherein the temperature control means is configured to hold the silicon ingot at an elevated temperature following removal of the molten quantity of silicon to remove stress-related structural defects in the silicon ingot, thereby enhancing silicon ingot quality.

* * * * *

UNITED STATES PATENT AND TRADEMARK OFFICE
CERTIFICATE OF CORRECTION

PATENT NO. : 8,882,912 B2  
APPLICATION NO. : 13/034956  
DATED : November 11, 2014  
INVENTOR(S) : Kirscht et al.

Page 1 of 1

It is certified that error appears in the above-identified patent and that said Letters Patent is hereby corrected as shown below:

On the Title page, in item (75), in "Inventors", in column 1, line 3, delete "Leipzig" and insert --Berlin--, therefor On the Title page, in item (75), in "Inventors", in column 1, line 5, delete "Berlin (DE)" and insert --Cupertino, (CA)--, therefor Signed and Sealed this
Tenth Day of March, 2015

Michelle K. Lee
*Deputy Director of the United States Patent and Trademark Office*